United States Patent
Maegawa et al.

(10) Patent No.: US 12,252,803 B2
(45) Date of Patent: Mar. 18, 2025

(54) N-TYPE SILICON SINGLE CRYSTAL PRODUCTION METHOD, N-TYPE SILICON SINGLE CRYSTAL INGOT, SILICON WAFER, AND EPITAXIAL SILICON WAFER

(71) Applicant: SUMCO CORPORATION, Tokyo (JP)

(72) Inventors: Koichi Maegawa, Tokyo (JP); Yasuhito Narushima, Tokyo (JP); Yasufumi Kawakami, Tokyo (JP); Fukuo Ogawa, Tokyo (JP); Ayumi Kihara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 18/202,024

(22) Filed: May 25, 2023

(65) Prior Publication Data
US 2023/0295835 A1 Sep. 21, 2023

Related U.S. Application Data

(62) Division of application No. 16/605,320, filed as application No. PCT/JP2018/011125 on Mar. 20, 2018, now Pat. No. 11,702,760.

(30) Foreign Application Priority Data

Apr. 25, 2017 (JP) ................................. 2017-086530
Apr. 25, 2017 (JP) ................................. 2017-086532

(51) Int. Cl.
*C30B 15/04* (2006.01)
*C30B 15/10* (2006.01)
(Continued)

(52) U.S. Cl.
CPC ............. *C30B 15/04* (2013.01); *C30B 15/10* (2013.01); *C30B 29/06* (2013.01); *C30B 35/002* (2013.01);
(Continued)

(58) Field of Classification Search
CPC ......... C30B 15/04; C30B 15/10; C30B 15/20; C30B 15/305; C30B 29/06; C30B 35/002; C30B 35/007; H01L 21/02002
See application file for complete search history.

(56) References Cited

U.S. PATENT DOCUMENTS

2007/0028833 A1    2/2007  Abe
2007/0105279 A1    5/2007  Falster et al.
(Continued)

FOREIGN PATENT DOCUMENTS

CN    101351580 A    1/2009
CN    102076890 A    5/2011
(Continued)

OTHER PUBLICATIONS

ISR for PCT/JP2018/011125, dated Jun. 5, 2018 (w/ translation).
(Continued)

*Primary Examiner* — Hua Qi
(74) *Attorney, Agent, or Firm* — Greenblum & Bernstein, P.L.C.

(57) ABSTRACT

A method for producing an n-type monocrystalline silicon that includes pulling up a monocrystalline silicon from a silicon melt containing a main dopant in a form of red phosphorus to grow the monocrystalline silicon. The monocrystalline silicon exhibits an electrical resistivity ranging from 1.7 mΩcm to 2.0 mΩcm, and is pulled up using a quartz crucible whose inner diameter ranges from 1.7-fold to 2.0-fold relative to a straight-body diameter of the monocrystalline silicon.

3 Claims, 5 Drawing Sheets

(51) Int. Cl.
  *C30B 29/06* (2006.01)
  *C30B 35/00* (2006.01)
  *H01L 21/02* (2006.01)
(52) U.S. Cl.
  CPC ...... *C30B 35/007* (2013.01); *H01L 21/02002* (2013.01)

(56) References Cited

U.S. PATENT DOCUMENTS

| | | | |
|---|---|---|---|
| 2009/0130824 | A1 | 5/2009 | Falster et al. |
| 2011/0140241 | A1* | 6/2011 | Kawazoe ................ C30B 15/14 264/145 |
| 2012/0279437 | A1 | 11/2012 | Johnson |
| 2017/0327966 | A1* | 11/2017 | Narushima ............. C30B 15/20 |

FOREIGN PATENT DOCUMENTS

| | | |
|---|---|---|
| CN | 102498545 A | 6/2012 |
| CN | 105121713 A | 12/2015 |
| DE | 102010007460 A1 | 8/2011 |
| JP | 2009-515370 A | 4/2009 |
| JP | 2009-292684 A | 12/2009 |
| JP | 2011-44505 A | 3/2011 |
| JP | 2011-93770 A | 5/2011 |
| JP | 2011-187651 A | 9/2011 |
| JP | 2014-513034 A | 5/2014 |
| JP | 2014-132600 A | 7/2014 |
| JP | 5890587 B | 3/2016 |
| JP | 2016-121032 A | 7/2016 |
| JP | 2017-43515 A | 3/2017 |
| WO | WO 2010/021272 A1 | 2/2010 |
| WO | WO 2012/141121 A1 | 10/2012 |
| WO | WO-2016103987 A1 * | 6/2016 ............. C30B 15/04 |

OTHER PUBLICATIONS

Written Opinion of the ISA for PCT/JP2018/011125, dated Jun. 5, 2018 (translation provided in IPRP).

IPRP for PCT/JP2018/011125, dated Oct. 29, 2019 (w/ translation).

Office Action for CN App. No. 201880027573.X, dated Jan. 8, 2021 (w/ translation).

Office Action for DE App. No. 112018002156.4, dated Jan. 25, 2022 (w/ translation).

"Resistivity Calculator (for Silicon)," Siegert Wafer, https://www.siegertwafer.de/rechner.html, accessed on Jan. 25, 2022 [Cited/discussed in DE Office Action (cite No. C05)].

Office Action for JP App. No. 2021-077913, dated Feb. 22, 2022 (w/ translation).

Office Action for CN App. No. 202210251415.0, dated Jul. 14, 2023 (w/ translation).

* cited by examiner

N-TYPE SILICON SINGLE CRYSTAL PRODUCTION METHOD, N-TYPE SILICON SINGLE CRYSTAL INGOT, SILICON WAFER, AND EPITAXIAL SILICON WAFER

This is a Divisional of U.S. application Ser. No. 16/605,320, which is a U.S. National Stage of PCT/JP2018/011125, filed Mar. 20, 2018, and claims priority to JP 2017-086530 and JP 2017-086532, both filed Apr. 25, 2017. The disclosure of each of the above-identified documents is herein incorporated by reference in its entirety.

TECHNICAL FIELD

The present invention relates to a producing method of an n-type silicon monocrystal, an ingot of an n-type silicon monocrystal, a silicon wafer, and an epitaxial silicon wafer.

BACKGROUND ART

In recent years, mobile devices such as mobile phones have been widely used. Such devices strongly requires long-term portability and usability. Accordingly, efforts have been made to increase a capacity of a battery installed in the mobile device and decrease power consumption of the mobile device itself.

In order to decrease power consumption of the mobile device itself, it is necessary to decrease power consumption of a semiconductor device installed in the mobile device.

For instance, since a low voltage power MOSFET (Metal Oxide Semi-Conductor Field Effect Transistor), which is used as an electric power device for a mobile device, has a certain internal electric resistance in an energized state, the low voltage power MOSFET itself consumes electric power in accordance with an electrical current passing through the low voltage power MOSFET.

Accordingly, if the internal resistance of the low voltage power MOSFET in the energized state can be reduced, power consumption of the mobile device can be lowered. Based on such a background, an n-type monocrystalline silicon having a low electric electrical resistivity (hereinafter, referred to as a low resistivity) is strongly demanded in order to reduce the internal resistance of the low voltage power MOSFET in the energized state.

In a typical producing method of monocrystalline silicon according to Czochralski process, Patent Literature 1 discloses that an inner diameter of a quartz crucible is preferably three times as large as a diameter (straight-body diameter) of the monocrystalline silicon and that, with this arrangement, the monocrystalline silicon can be stably pulled up even when the diameter of the monocrystalline silicon is large.

A dopant capable of reducing a resistivity of a silicon wafer is exemplified by red phosphorus and arsenic. Patent Literature 2 discloses use of red phosphorus as the dopant for the low resistivity.

Further, Patent Literature 3 discloses use of arsenic as the dopant for the low resistivity.

CITATION LIST

Patent Literatures

Patent Literature 1 JP 2009-292684 A
Patent Literature 2 Japanese Patent No. 5890587
Patent Literature 3 JP 2011-44505 A

SUMMARY OF THE INVENTION

Problem(s) to be Solved by the Invention

However, when the above technique described in Patent Literature 1 is used for pulling up n-type monocrystalline silicon having a low resistivity, an n-type dopant (e.g., red phosphorus and arsenic), which is a volatile dopant, evaporates during the pulling up of the monocrystalline silicon to decrease a yield of the monocrystalline silicon having a desired low resistivity and cause occurrence of dislocations in the monocrystalline silicon due to an increase in the added amount of the n-type dopant.

In the disclosure of Patent Literature 2, a silicon wafer having a low resistivity can be produced with red phosphorus as a dopant. However, Example only shows a silicon wafer having a 200-mm diameter.

Further, in the disclosure of Patent Literature 3, a silicon wafer having a low resistivity can be produced with arsenic as a dopant. However, Example only shows a silicon wafer having a 150-mm diameter.

An object of the invention is to provide a producing method of n-type monocrystalline silicon capable of preventing a decrease in a yield of the monocrystalline silicon and preventing occurrence of dislocations in the monocrystalline silicon, an ingot of the n-type monocrystalline silicon, a silicon wafer having a diameter of 200 mm or more, and an epitaxial silicon wafer.

Means for Solving the Problem(s)

According to an aspect of the invention, a producing method is for an n-type monocrystalline silicon by pulling up a monocrystalline silicon from a silicon melt containing a main dopant in a form of red phosphorus and growing the monocrystalline silicon according to a Czochralski process, in which the monocrystalline silicon, a part of which exhibits an electrical resistivity ranging from 0.5 mΩcm to 1.0 mΩcm, is pulled up using a quartz crucible whose inner diameter ranges from 1.7-fold to 2.3-fold relative to a straight-body diameter of the monocrystalline silicon.

Herein, the straight-body diameter refers to a diameter of a portion, from which a silicon wafer is cut out, of the pulled up monocrystalline silicon, the diameter being controlled to be substantially constant.

According to the above aspect of the invention, an area of a free surface of the melt in the quartz crucible can be reduced by using the quartz crucible whose inner diameter ranges from 1.7-fold to 2.3-fold relative to the straight-body diameter of the monocrystalline silicon. Accordingly, evaporation of red phosphorus as the dopant in the melt can be prevented to avoid a decrease in a yield of a portion with a low resistivity in the monocrystalline silicon.

Moreover, since the prevention of the evaporation of red phosphorus leads to avoiding addition of a lot of amounts of red phosphorus at the start of the pulling up, occurrence of dislocations in the monocrystalline silicon can be prevented.

In other words, according to the above aspect of the invention, by preventing the evaporation of red phosphorus in the melt while preventing dislocations in the monocrystalline silicon due to a highly concentrated red phosphorus at the start of the pulling up of the monocrystalline silicon, the concentration of red phosphorus in the melt can be increased in accordance with the progress of the pulling up, so that the monocrystalline silicon having a low resistivity can be obtained.

In the above arrangement, preferably, the straight-body diameter of the monocrystalline silicon ranges from 201 mm to 230 mm, and the inner diameter of the quartz crucible ranges from 2.1-fold to 2.3-fold relative to the straight-body diameter of the monocrystalline silicon.

Since the evaporation of red phosphorus can be prevented when the monocrystalline silicon has the straight-body diameter ranging from 201 mm to 230 mm, the above functions and effects can be obtained when the inner diameter of the quartz crucible is designed within the above range.

In the above arrangement, the electrical resistivity of the part of the monocrystalline silicon preferably ranges from 0.5 mΩcm to 0.7 mΩcm.

Even in the above range of the electrical resistivity, the pulled-up monocrystalline silicon can be dislocation-free by determining the inner diameter of the quartz crucible to fall in a range from 2.1-fold to 2.3-fold relative to the straight-body diameter of the monocrystalline silicon.

In the above arrangement, preferably, the straight-body diameter of the monocrystalline silicon ranges from 301 mm to 330 mm, and the inner diameter of the quartz crucible ranges from 1.7-fold to 2.0-fold relative to the straight-body diameter of the monocrystalline silicon.

Since the evaporation of red phosphorus can be prevented when the monocrystalline silicon has the straight-body diameter ranging from 301 mm to 330 mm, the above functions and effects can be obtained when the inner diameter of the quartz crucible is designed within the above range.

In the above arrangement, the electrical resistivity of the part of the monocrystalline silicon preferably ranges from 0.8 mΩcm to 1.0 mΩcm.

Even in the above range of the electrical resistivity, the pulled-up monocrystalline silicon can be dislocation-free by determining the inner diameter of the quartz crucible to fall in a range from 1.7-fold to 2.0-fold relative to the straight-body diameter of the monocrystalline silicon.

According to another aspect of the invention, a producing method is for an n-type monocrystalline silicon by pulling up a monocrystalline silicon from a silicon melt containing a main dopant in a form of arsenic and growing the monocrystalline silicon according to a Czochralski process, in which the monocrystalline silicon is pulled up using a quartz crucible whose inner diameter ranges from 1.7-fold to 2.0-fold relative to a straight-body diameter of the monocrystalline silicon, in which a part of the monocrystalline silicon exhibits an electrical resistivity ranging from 1.7 mΩcm to 2.0 mΩcm and the straight-body diameter of the monocrystalline silicon ranges from 301 mm to 330 mm.

Also according to the above aspect of the invention, the same functions and effects as those described above can be obtained.

Specifically, according to the above aspect of the invention, by preventing evaporation of arsenic in the melt while preventing dislocations in the monocrystalline silicon due to a highly concentrated arsenic at the start of the pulling up of the monocrystalline silicon, the concentration of arsenic in the melt can be increased in accordance with the progress of the pulling up, so that the monocrystalline silicon having a low resistivity can be obtained.

In the above arrangement, the monocrystalline silicon is preferably pulled up using a pull-up apparatus whose furnace internal pressure is set in a range from 40 kPa to 80 kPa.

In this arrangement, the evaporation of red phosphorus and arsenic can be prevented by determined the furnace internal pressure of the pull-up apparatus to be 40 kPa or more. On the other hand, by determining the furnace internal pressure to be 80 kPa or less, occurrence of dislocations caused by concentration of the dopant in the silicon melt due to segregation of the dopant can be prevented.

In the above arrangement, the silicon met in the quartz crucible is preferably applied with a magnetic field having a magnetic field intensity ranging from 0.2 T to 0.4 T in pulling up the monocrystalline silicon.

In this arrangement, since the application of the magnetic field with the magnetic field intensity ranging from 0.2 T to 0.4 T can prevent in-plane fluctuation of the monocrystalline silicon during the pulling up, the monocrystalline silicon can be reliably pulled up without causing dislocations.

According to still another aspect of the invention, an ingot of n-type monocrystalline silicon contains a main dopant in a form of red phosphorus, in which the ingot has a straight-body diameter ranging from 301 mm to 330 mm, and a part of the ingot exhibits an electrical resistivity ranging from 0.8 mΩcm to 1.0 mΩcm.

According to a further aspect of the invention, a silicon wafer is cut out from the ingot of the n-type monocrystalline silicon according to the above aspect of the invention, and the silicon wafer exhibits an electrical resistivity ranging from 0.8 mΩcm to 1.0 mΩcm and has a diameter of 300 mm.

According to a still further aspect of the invention, an epitaxial silicon wafer has an epitaxial film formed on a surface of the silicon wafer according to the above aspect of the invention.

According to the above aspects of the invention, the monocrystalline silicon ingot containing red phosphorus as the dopant and having an unusually large diameter of 300 mm and a low resistivity, the silicon wafer having a low resistivity, and the epitaxial silicon wafer having a low resistivity can be obtained.

According to a still further aspect of the invention, an ingot of n-type monocrystalline silicon contains a main dopant in a form of arsenic, in which the ingot has a straight-body diameter ranging from 301 mm to 330 mm, and a part of the ingot exhibits an electrical resistivity ranging from 1.7 mΩcm to 2.0 mΩcm.

According to a still further aspect of the invention, a silicon wafer is cut out from the ingot of the n-type monocrystalline silicon according to the above aspect of the invention, and the silicon wafer exhibits an electrical resistivity ranging from 1.7 mΩcm to 2.0 mΩcm and has a diameter of 300 mm.

According to a still further aspect of the invention, an epitaxial silicon wafer has an epitaxial film formed on a surface of the silicon wafer according to the above aspect of the invention.

According to the above aspects of the invention, the monocrystalline silicon ingot containing arsenic as the dopant and having an unusually large diameter of 300 mm and a low resistivity, the silicon wafer having a low resistivity, and the epitaxial silicon wafer having a low resistivity can be obtained.

BRIEF DESCRIPTION OF DRAWING(S)

FIG. 1 schematically illustrates an exemplary structure of a pull-up apparatus of monocrystalline silicon according to an exemplary embodiment of the invention.

DESCRIPTION OF EMBODIMENT(S)

[1] Structure of Pull-Up Apparatus 1 for Monocrystalline Silicon

Figure 1:
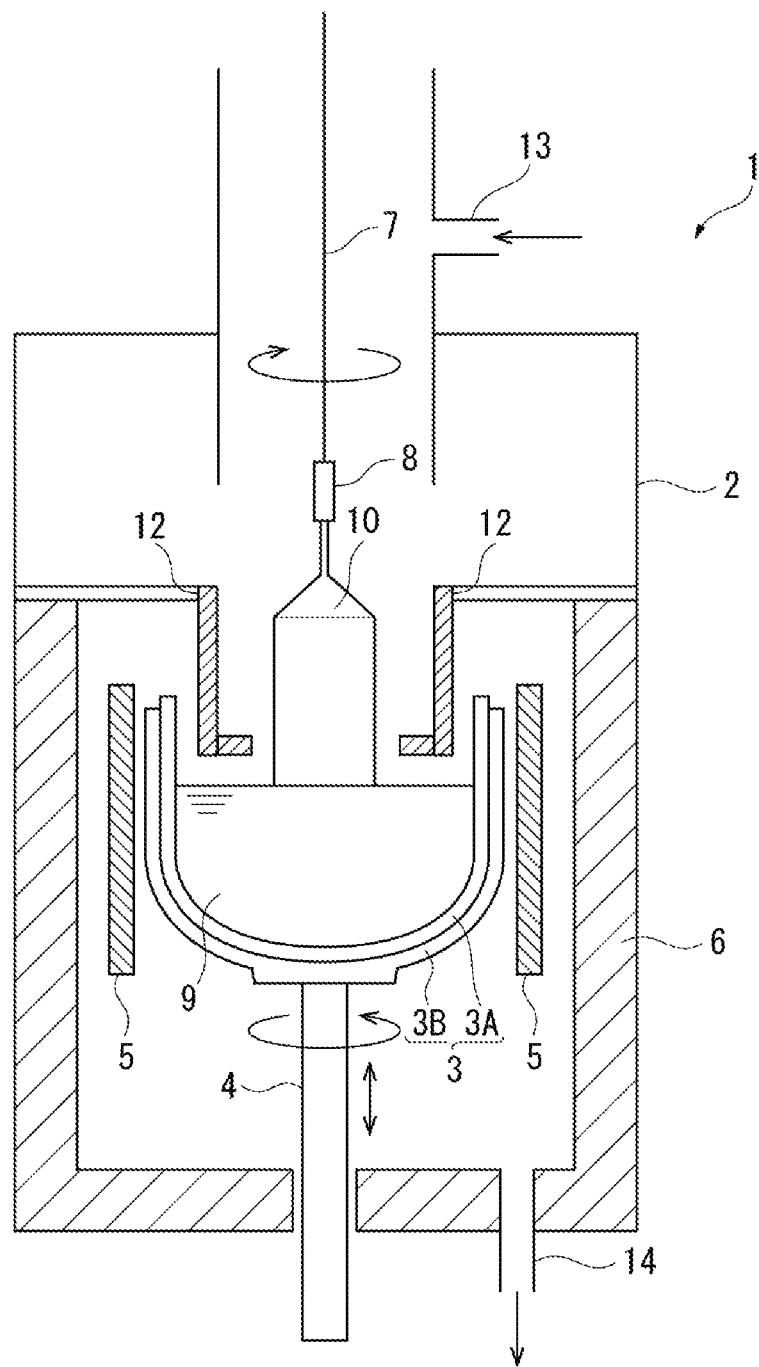

FIG. 1 schematically shows an exemplary structure of a pull-up apparatus 1 for monocrystalline silicon. A producing method of monocrystalline silicon according to an exemplary embodiment of the invention is applicable to the pull-up apparatus 1. The pull-up apparatus 1, which pulls up monocrystalline silicon 10 according to the Czochralski process, includes a chamber 2 defining an external body and a crucible 3 disposed at the center of the chamber 2.

The crucible 3, which has a double structure formed by an inner quartz crucible 3A and an outer graphite crucible 3B, is fixed to an upper end of a support shaft 4 that is rotatable and vertically movable.

An inner diameter of the inner quartz crucible 3A of the crucible 3 is determined to fall in a range from 1.7-fold to 2.3-fold relative to the straight-body diameter of the pulled-up monocrystalline silicon 10.

Specifically, when the straight-body diameter of the monocrystalline silicon 10 ranges from 201 mm to 230 mm, the inner diameter of the quartz crucible 3A preferably ranges from 2.1-fold to 2.3-fold relative to the straight-body diameter of the monocrystalline silicon 10. When the straight-body diameter of the monocrystalline silicon 10 ranges from 301 mm to 330 mm, the inner diameter of the quartz crucible 3A preferably ranges from 1.7-fold to 2.0-fold relative to the straight-body diameter of the monocrystalline silicon 10.

Since the larger inner diameter of the crucible 3 than the above inner diameter increases a size of a heat shield plate 12 and an opening diameter of the chamber 2, the evaporated dopant is likely to adhere on a furnace body to cause foreign substances to adhere on the monocrystalline silicon 10, resulting in occurrence of dislocations.

Since a gap between the monocrystalline silicon 10 and the quartz crucible 3A can be reduced by determining the inner diameter of the crucible 3 in the above range, evaporation of the dopant (e.g., red phosphorus and arsenic) is reducible and occurrence of dislocations, at a start portion of the straight body, caused by segregation phenomenon of the dopant is preventable.

A resistance heater 5 is provided to an exterior of the crucible 3 in a manner to surround the crucible 3. A heat insulation material 6 is provided outside the heater 5 and along an inner surface of the chamber 2. The heater 5 is not necessarily in a form of a single body but may be in a form of separate bodies (i.e., upper body and lower body) capable of each independently setting a temperature.

A pulling shaft 7 (e.g., wire), which is rotatable at a predetermined speed coaxially with the support shaft 4 and in a direction opposite from or the same as the direction of the support shaft 4, is provided above the crucible 3. A seed crystal 8 is attached to a lower end of the pulling shaft 7.

A cylindrical water-cooled body surrounding the monocrystalline silicon 10 during the growth may be provided above a silicon melt 9 in the chamber 2.

The water-cooled body, which is made of a metal excellent in thermal conductivity (e.g., copper), is forcibly cooled by cooling water circulating inside the water-cooled body. The water-cooled body promotes cooling the monocrystalline silicon 10 during the growth to control a temperature gradient of a central portion of the monocrystalline silicon 10 and a peripheral portion of the monocrystalline silicon 10 in a direction of the pulling shaft.

The cylindrical heat shield plate 12 is disposed in the chamber 2.

The heat shield plate 12 shields the monocrystalline silicon 10 during the growth from high-temperature radiation heat from the silicon melt 9 in the crucible 3, the heater 5, and a side wall of the crucible 3. Near a solid-liquid interface (crystal growth interface), the heat shield plate 12 also prevents heat diffusion to the outside and controls the temperature gradient of the central portion of the monocrystalline silicon 10 and the peripheral portion of the monocrystalline silicon 10 in the direction of the pulling shaft.

A gas inlet 13 for introducing inert gas (e.g. Ar gas) into the chamber 2 is provided at an upper part of the chamber 2. A gas outlet 14, through which the gas in the chamber 2 is sucked and discharged when a vacuum pump (not shown) is driven, is provided at a lower portion of the chamber 2.

The inert gas introduced from the gas inlet 13 into the chamber 2 flows down between the growing monocrystalline silicon 10 and the heat shield plate 12, flowing through a gap (liquid surface Gap) between the lower end of the heat shield plate 12 and the liquid surface of the silicon melt 9, toward an outside of the heat shield plate 12, further an outside of the crucible 3, and subsequently flowing down along the outside of the crucible 3 to be discharged from the exhaust outlet 14.

For the growth of the monocrystalline silicon 10 using the above growth device, while an inside of the chamber 2 is kept under an inert gas atmosphere and reduced pressure, a solid material (e.g., polycrystalline silicon) filled in the crucible 3 is heated by the heater 5 to be melted, thereby forming the silicon melt 9. After the silicon melt 9 is formed in the crucible 3, the pulling shaft 7 is lowered to soak the seed crystal 8 in the silicon melt 9. While the crucible 3 and the pulling shaft 7 are rotated in a predetermined direction(s), the pulling shaft 7 is gradually pulled up, thereby growing the monocrystalline silicon 10 continuous with the seed crystal 8.

[2] Monocrystalline Silicon Production Method

When the monocrystalline silicon 10 (i.e., an n-type silicon monocrystal according to the exemplary embodiment) is produced using the above pull-up apparatus 1, red phosphorus or arsenic is added as a main dopant to the silicon melt 9 at the start of the pulling up or added as needed during the pulling up, whereby the monocrystalline silicon 10 can be produced. When red phosphorus or arsenic is used as the main dopant, red phosphorus or arsenic accounts for 50 mass % or more of an n-type dopant. However, another dopant may be further added.

In the pulling up of an ingot of the monocrystalline silicon 10 having the straight-body diameter ranging from 201 mm to 230 mm, when the dopant is red phosphorus, a resistivity of the monocrystalline silicon 10 at a straight-body start point is controlled to fall in a range from 0.8 mΩcm to 1.05 mΩcm. Subsequently, the resistivity of the monocrystalline silicon 10 is sequentially decreased in accordance with the growth of the monocrystalline silicon 10 by pulling up the monocrystalline silicon 10, thereby finally obtaining the monocrystalline silicon 10 having the resistivity ranging from 0.5 mΩcm to 0.7 mΩcm.

In the pulling up of the ingot of the monocrystalline silicon 10 having the straight-body diameter ranging from 301 mm to 330 mm, when the dopant is red phosphorus, the resistivity of the monocrystalline silicon 10 at the straight-body start point is controlled to fall in a range from 1.2 mΩcm to 1.7 mΩcm. Subsequently, the resistivity of the monocrystalline silicon 10 is sequentially decreased in accordance with the growth of the monocrystalline silicon 10 by pulling up the monocrystalline silicon 10, thereby finally obtaining the monocrystalline silicon 10 whose resistivity at a part of the ingot ranges from 0.8 mΩcm to 1.0 mΩcm.

In the pulling up of the ingot of the monocrystalline silicon 10 having the straight-body diameter ranging from 301 mm to 330 mm, when the dopant is arsenic, the resistivity of the monocrystalline silicon 10 at the straight-body start point is controlled to fall in a range from 2.5 mΩcm to 3.1 mΩcm. Subsequently, the resistivity of the monocrystalline silicon 10 is sequentially decreased in accordance with the growth of the monocrystalline silicon 10 by pulling up the monocrystalline silicon 10, thereby finally obtaining the monocrystalline silicon 10 whose resistivity at the part of the ingot ranges from 1.7 mΩcm to 2.0 mΩcm.

The ingot of the monocrystalline silicon 10 according to the exemplary embodiment can be pulled up under usual pulling-up conditions. At this time, in order to increase a concentration of the dopant (e.g., red phosphorus and arsenic) in the silicon melt 9 inside the crucible 3, for instance, an added amount of the dopant is changed during the pulling up, segregation phenomenon in accordance with the pulling up is used for increasing the dopant concentration, and/or an introduction amount of inert gas into the chamber 2 is changed to prevent evaporation of the dopant, resulting in a change in an internal pressure of the chamber 2.

Specifically, in order to reduce the evaporation of the dopant and increase the dopant concentration in the silicon melt 9 in the crucible 3 in the first half of the pulling up of the straight body of the monocrystalline silicon 10, an Ar flow rate is determined to fall in a range from 50 L/min to 150 L/min and the internal pressure of the furnace is determined to fall in a range from 40 kPa to 80 kPa.

On the other hand, in order to maintain the dopant concentration in the silicon melt 9 of the crucible 3 by promoting the evaporation of the dopant and cancelling the concentration of the dopant with the concentrated dopant concentration caused by segregation of the dopant in accordance with the progress of the growth of the monocrystalline silicon 10 in the later time of the pulling up of the straight body of the monocrystalline silicon 10, the Ar flow rate is determined to fall in a range from 50 L/min to 200 L/min and the internal pressure of the furnace is determined to fall in a range from 20 kPa to 80 kPa, preferably from 30 kPa to 40 kPa.

Moreover, in the pulling up of the monocrystalline silicon 10, it is preferable to apply a magnetic field having a magnetic field intensity ranging from 0.2 T to 0.4 T. The application of the magnetic field can prevent the monocrystalline silicon 10 that is being pulled up from causing a melt flow and can reduce uneven temperatures and turbulence phenomenon in the melt, so that the monocrystalline silicon 10 can be reliably pulled up without causing dislocations.

In the pulling up of the monocrystalline silicon 10, when the heater 5 is in a form of an upper heater and a lower heater which are each independently capable of setting a temperature, a value of a ratio of a heating amount of the lower heater to a heating amount of the upper heater is preferably in a range from 1 to 4.

At the ratio of less than 1, in other words, when the heating amount of the lower heater is smaller than the heating amount of the upper heater, a convective flow of the silicon melt from the bottom of the crucible 3 toward underneath of the solid-liquid interface becomes not strong enough to soften the unstable convective flow in terms of a liquid temperature to the monocrystalline silicon from the surface of the silicon melt 9 added with the dopant, so that occurrence of dislocations caused by the unstable temperature cannot be prevented.

On the other hand, when the ratio of the heating amount exceeds 4, a heat load applied to a lower portion of the crucible is increased, so that deformation of the crucible 3 and peeling of quartz from the crucible 3 are likely to occur.

In the formation of the shoulder of the monocrystalline silicon 10, it is preferable to pull up the monocrystalline silicon 10 in a manner to avoid occurrence of a re-melt region having a large height (e.g., 200 µm or more). The re-melt region refers to a region where the monocrystalline silicon 10 solidified after being pulled up from the silicon melt 9 is again melted to become liquid during the pulling up.

Specifically, in the formation of the shoulder, the monocrystalline silicon 10 is initially pulled up while the crucible 3 is rotated at the rotation speed ranging from 16 rpm to 30 rpm. Subsequently, when a diameter of the shoulder becomes equal to or more than a half of the straight-body diameter of the monocrystalline silicon 10, the rotation speed of the crucible 3 is gradually decreased to fall in a range from 4 rpm to 12 rpm.

When the monocrystalline silicon 10 is pulled up at the rotation speed exceeding 30 rpm in the initial formation of the shoulder, an operation of the pull-up apparatus 1 is not stabilized, so that the shoulder is highly likely to be deformed.

Next, when the diameter of the shoulder becomes equal to or more than the half of the straight-body diameter of the monocrystalline silicon 10, and when the rotation speed of the crucible 3 is less than 4 rpm, the silicon melt 9 added with the dopant is not stabilized, so that dislocations are highly likely to occur.

On the other hand, when the rotation speed of the crucible 3 exceeds 12 rpm, in-plane fluctuations in an oxygen density and a resistivity of the monocrystalline silicon 10 are increased, failing to achieve a stable crystal quality.

In the formation of the straight body of the monocrystalline silicon 10, it is preferable to pull up the monocrystalline silicon 10 in a manner to avoid occurrence of the re-melt region having a large height (e.g., 200 µm or more). Specifically, in the formation of the straight body, the monocrystalline silicon 10 is initially pulled up while the crucible 3 is rotated at the rotation speed ranging from 9 rpm to 30 rpm. Subsequently, when the straight body of the monocrystalline silicon 10 is pulled up by a length in a range from 50 mm to 200 mm, the rotation speed of the crucible 3 is changed to a range from 0.1 rpm to 7 rpm.

When the monocrystalline silicon 10 is pulled up at the rotation speed exceeding 30 rpm in the initial formation of the straight body, the operation of the pull-up apparatus 1 is not stabilized, so that the straight body is highly likely to be deformed.

Next, when the straight body is pulled up at the rotation speed of the crucible 3 of less than 0.1 rpm in a range from 50 mm to 200 mm from a start point of the straight body, the silicon melt 9 added with the dopant is not stabilized, so that dislocations are highly likely to occur.

However, when the rotation speed of the crucible 3 exceeds 7 rpm, in-plane fluctuations in the oxygen density and the electric resistivity of the monocrystalline silicon 10 are increased to cause an unstable crystal quality.

When the dopant is red phosphorus, a part close to a tail of the monocrystalline silicon 10 pulled up by the pull-up apparatus 1 and having the straight-body diameter ranging from 201 mm to 230 mm provides the monocrystalline silicon 10 in a form of an ingot having a resistivity ranging from 0.5 mΩcm to 0.7 mΩcm.

After a periphery of the ingot of the monocrystalline silicon 10 is ground to provide the ingot having the straight-body diameter of 200 mm, the ingot is cut with a wire saw and the like into a silicon wafer. The silicon wafer obtained by cutting is subjected to lapping and polishing, so that the silicon wafer having the resistivity ranging from 0.5 mΩcm to 0.7 mΩcm and having the diameter of 200 mm can be obtained.

Further, after the silicon wafer is machined, an epitaxial film is formed on a surface of the silicon wafer to produce an epitaxial silicon wafer having a 200-mm diameter for shipment to a customer.

When the dopant is red phosphorus, a part close to a tail of the monocrystalline silicon 10 having the straight-body diameter ranging from 301 mm to 330 mm provides the monocrystalline silicon 10 in a form of an ingot having a resistivity ranging from 0.8 mΩcm to 1.0 mΩcm.

After a periphery of the ingot of the monocrystalline silicon 10 is ground to provide an ingot having the straight-body diameter of 300 mm, the ingot is cut with a wire saw and the like into a silicon wafer. The silicon wafer obtained by cutting is subjected to lapping and polishing, so that the silicon wafer having the resistivity ranging from 0.8 mΩcm to 1.0 mΩcm and having the diameter of 300 mm can be obtained.

Further, after the silicon wafer is machined, an epitaxial growth film is formed on a surface of the silicon wafer to produce an epitaxial silicon wafer having a 300-mm diameter for shipment to a customer.

When the dopant is arsenic, a part close to a tail of the monocrystalline silicon 10 having the straight-body diameter ranging from 301 mm to 330 mm provides the monocrystalline silicon 10 in a form of an ingot having a resistivity ranging from 1.7 mΩcm to 2.0 mΩcm.

After a periphery of the ingot of the monocrystalline silicon 10 is ground to provide an ingot having the straight-body diameter of 300 mm, the ingot is cut with a wire saw and the like into a silicon wafer. The silicon wafer obtained by cutting is subjected to lapping and polishing, so that the silicon wafer having the diameter of 300 mm can be obtained.

Further, after the silicon wafer is machined, an epitaxial film is formed on a surface of the silicon wafer to produce an epitaxial silicon wafer having a 300-mm diameter for shipment to a customer.

EXAMPLES

Next, Examples of the invention will be described. It should be understood that the scope of the invention is not limited to Examples shown below but includes other configurations as long as an object of the invention is achievable.

[1] Ingot of Monocrystalline Silicon 10 Having Straight-Body Diameter Ranging from 201 mm to 230 mm When pulling up the monocrystalline silicon 10 having a straight-body diameter (hereinafter, sometimes referred to as a crystal diameter) ranging from 201 mm to 230 mm, the resistivity of the monocrystalline silicon 10 at the straight-body start point (i.e., shoulder finish point) was controlled to a range from 0.8 mΩcm to 1.05 mΩcm. A ratio of the inner diameter of the crucible 3 to the crystal diameter (=[inner diameter of crucible 3]/[crystal diameter]) was determined to fall in a range from 2.1 to 2.3 in Examples and to fall in a range from 2.6 to 3.0 in Comparative Examples and Reference Examples. A charge amount was determined to fall in a range from 80 kg to 180 kg. A pull-up speed was determined to fall in a range from 0.3 mm/min to 1.0 mm/min. A crystal rotation speed was determined to fall in a range from 9 rpm to 17 rpm. The rotation speed of the crucible 3 was determined to fall in a range from 0.2 rpm to 22 rpm.

Further, in the first half of the straight body of the monocrystalline silicon 10, the argon gas flow rate was determined to fall in a range from 50 L/min to 150 L/min, and the furnace internal pressure was determined to fall in a range from 40 kPa to 80 kPa. In the last half of the straight body of the monocrystalline silicon 10, the argon gas flow rate was determined to fall in a range from 50 L/min to 200 L/min, and the furnace internal pressure was determined to fall in a range from 20 kPa to 80 kPa.

[1-1] Resistivity Ranging from 0.6 mΩcm to 0.7 mΩcm

Figure 2:
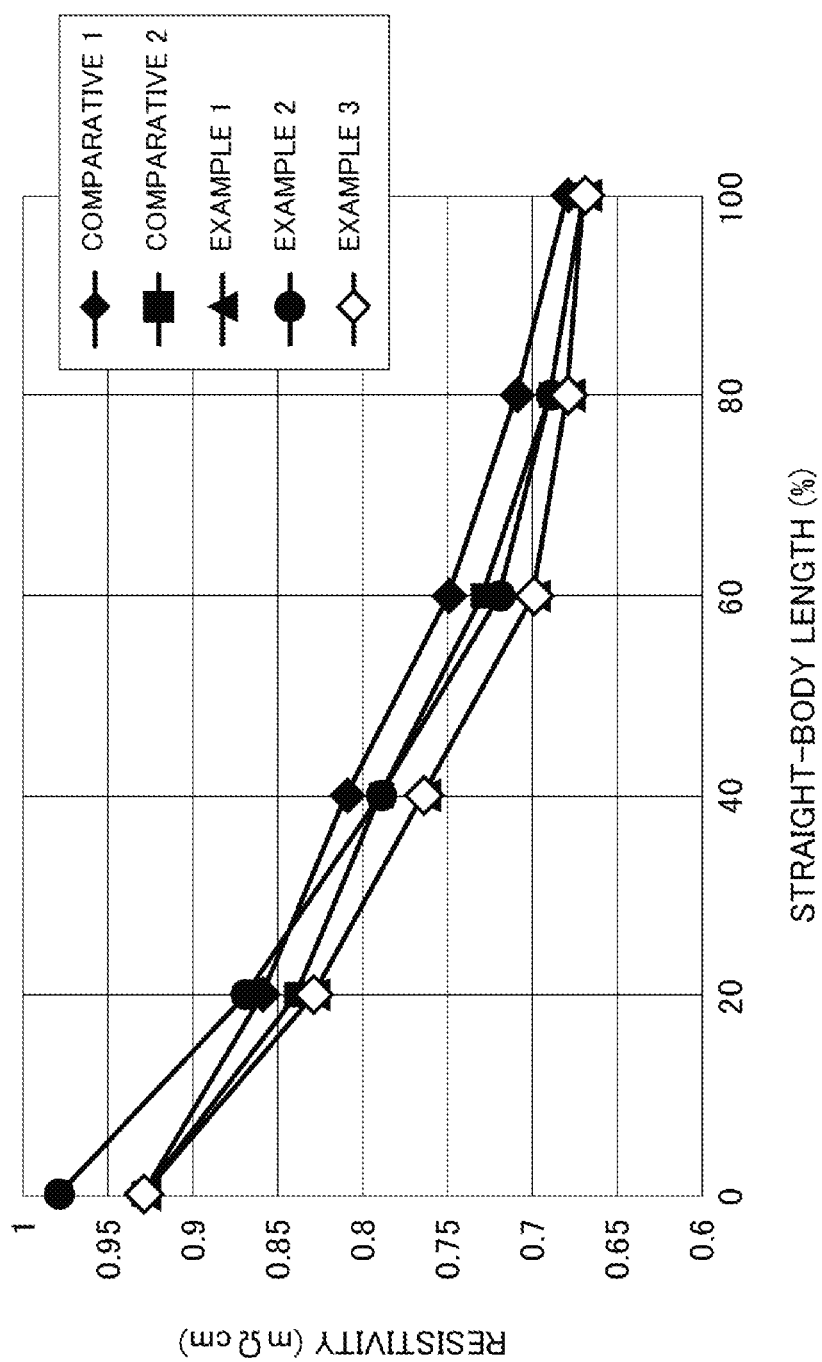
FIG. 2 is a graph showing a relationship between a straight-body length and a resistivity in monocrystalline silicon (straight-body diameter ranging from 201 mm to 230 mm) in Examples with red phosphorus as a dopant.

An inner diameter of the quartz crucible 3A was changed relative to the straight-body diameter of the monocrystalline silicon 10. While the resistivity was controlled according to a plurality of standards: specifically, the addition of red phosphorus as the dopant; the Ar flow rate; the furnace internal pressure; a height of the heat shield plate 12 from the liquid surface; the pull-up speed of the monocrystalline silicon 10; and a combination thereof, the monocrystalline silicon 10 doped with red phosphorus was pulled up. Results are shown in Table 1 and FIG. 2. In the following description, a straight-body length 0% point refers to the straight-body start point of the monocrystalline silicon 10, and a straight-body length 100% point refers to a tail start point of the monocrystalline silicon 10. A straight-body pass length refers to a value obtained by dividing a length of a straight-body region having a satisfactory resistivity (within a desired range of the resistivity) and being dislocation-free by a whole length of the straight body. A dislocation-free success rate refers to a rate of the number of trials that succeeded in pulling up the monocrystalline silicon 10 in a dislocation-free state relative to the number of trials for pulling up the monocrystalline silicon 10.

TABLE 1

|  |  | Comparative 1 | Comparative 2 | Example 1 | Example 2 | Example 3 |
|---|---|---|---|---|---|---|
| crucible inner diameter (inch) | | 24" | 22" | 18" | 18" | 18" |
| crystal diameter (mm) | | 206 | 207 | 208 | 205 | 215 |
| ratio of crucible inner diameter to crystal diameter | | 2.96 | 2.70 | 2.20 | 2.23 | 2.13 |
| dopant | | red phosphorus | red phosphorus | red phosphorus | red phosphorus | red phosphorus |
| resistivity [mΩcm] | straight-body length 0% point (end of shoulder) | 0.93 | 0.93 | 0.93 | 0.98 | 0.93 |
| | straight-body length 20% point | 0.86 | 0.84 | 0.83 | 0.87 | 0.83 |
| | straight-body length 40% point | 0.81 | 0.79 | 0.765 | 0.79 | 0.765 |
| | straight-body length 60% point | 0.75 | 0.73 | 0.7 | 0.72 | 0.7 |
| | straight-body length 80% point | 0.71 | 0.69 | 0.68 | 0.69 | 0.68 |
| | straight-body length 100% point (tail start point) | 0.68 | 0.67 | 0.67 | 0.67 | 0.67 |
| straight-body pass length | | 12% | 25% | 40% | 28% | 40% |
| number of trials with dislocations | | 4 | 53 | 32 | 7 | 4 |
| number of dislocation-free trials | | 2 | 32 | 25 | 8 | 6 |
| dislocation-free success rate | | 33% | 38% | 44% | 53% | 60% |

Comparing Comparatives 1 and 2 with Examples 1 to 3, Examples 1 to 3 apparently show a higher dislocation-free success rate to increase a crystal yield, so that it is found that a part of the ingot of the monocrystalline silicon 10 can contain a larger region having a resistivity ranging from 0.6 mΩcm to 0.7 mΩcm. Accordingly, when the dopant is red phosphorus and the ingot of the monocrystalline silicon 10 having the target resistivity ranging from 0.6 mΩcm to 0.7 mΩcm is produced, it has been found that the inner diameter of the quartz crucible 3A preferably ranges from 2.1-fold to 2.3-fold relative to the straight-body diameter of the monocrystalline silicon 10.

[1-2] Resistivity Ranging from 0.5 mΩcm to 0.6 mΩcm

In a part of the ingot of the monocrystalline silicon 10 having the straight-body diameter ranging from 201 mm to 230 mm, it was examined how the inner diameter of the quartz crucible 3A exerted an influence on the resistivity falling in a range from 0.5 mΩcm to 0.6 mΩcm.

Specifically, resistivity control by controlling the Ar flow rate, the furnace internal pressure, and the pull-up speed is a two-way control of evaporation prevention and evaporation promotion. Evaporation is prevented on the monocrystalline silicon 10 from a crystal top to a portion having a resistivity equal to or less than a desired value. Next, when the resistivity falls within a desired range, the resistivity control is changed to the evaporation promotion in order to cancel effects of segregation. In a range from 0.5 mΩcm to 0.6 mΩcm relative to the target value ranging from 0.6 mΩcm to 0.7 mΩcm, an evaporation prevention duration is long until the later time of the pulling up of the monocrystalline silicon (just before the resistivity reaches 0.6 mΩcm).

Figure 3:
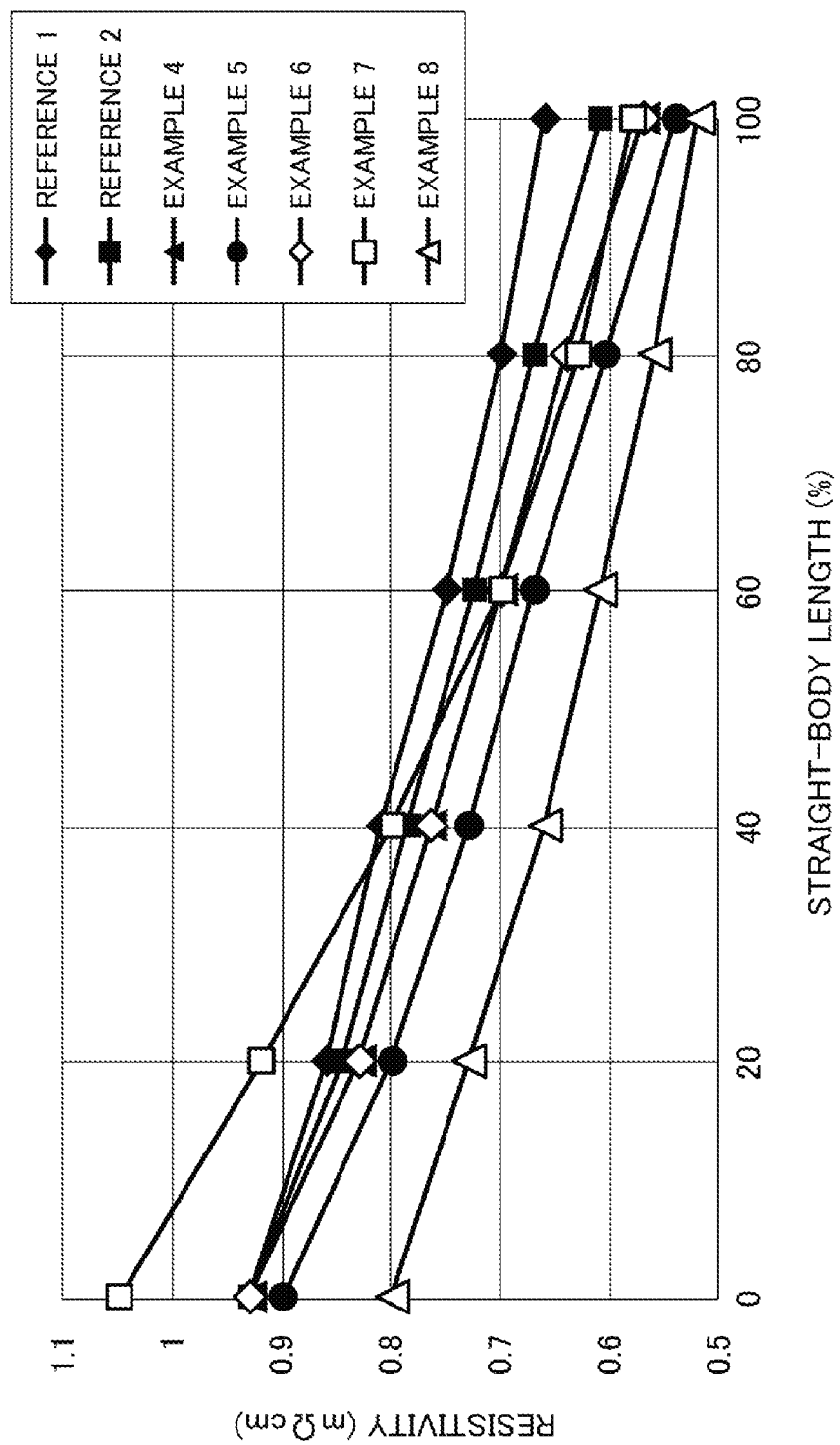
FIG. 3 is a graph showing a relationship between a straight-body length and a resistivity in monocrystalline silicon (straight-body diameter ranging from 201 mm to 230 mm) in other Examples with red phosphorus as the dopant.

Results are shown in Table 2 and FIG. 3.

TABLE 2

|  |  | Reference 1 | Reference 2 | Example 4 | Example 5 | Example 6 | Example 7 | Example 8 |
|---|---|---|---|---|---|---|---|---|
| crucible inner diameter (inch) | | 24" | 22" | 18" | 18" | 18" | 18" | 18" |
| crystal diameter (mm) | | 208 | 209 | 206 | 205 | 215 | 206 | 206 |
| ratio of crucible inner diameter to crystal diameter | | 2.93 | 2.67 | 2.22 | 2.23 | 2.13 | 2.22 | 2.22 |
| dopant | | red phosphorus | red phosphorus | red phosphorus | red phosphorus | red phosphorus | red phosphorus | red phosphorus |
| resistivity [mΩcm] | straight-body length 0% point (end of shoulder) | 0.93 | 0.93 | 0.93 | 0.9 | 0.93 | 1.05 | 0.8 |
| | straight-body length 20% point | 0.86 | 0.845 | 0.83 | 0.8 | 0.83 | 0.92 | 0.73 |
| | straight-body length 40% point | 0.81 | 0.785 | 0.765 | 0.73 | 0.765 | 0.8 | 0.66 |
| | straight-body length 60% point | 0.75 | 0.725 | 0.7 | 0.67 | 0.7 | 0.7 | 0.61 |
| | straight-body length 80% point | 0.7 | 0.67 | 0.64 | 0.605 | 0.64 | 0.63 | 0.56 |
| | straight-body length 100% point (tail start point) | 0.66 | 0.61 | 0.57 | 0.54 | 0.57 | 0.58 | 0.52 |

TABLE 2-continued

|  | Reference 1 | Reference 2 | Example 4 | Example 5 | Example 6 | Example 7 | Example 8 |
|---|---|---|---|---|---|---|---|
| crystal pass length | 0% | 0% | 10% | 19% | 10% | 10% | 35% |
| number of trials with dislocations | 11 | 7 | 6 | 5 | 4 | 6 | 7 |
| number of dislocation-free trials | 3 | 2 | 3 | 2 | 2 | 3 | 2 |
| dislocation-free success rate | 21% | 22% | 33% | 29% | 33% | 33% | 22% |

In Reference Examples 1 and 2, the crystal pass length was 0%, showing that a part of the ingot of the monocrystalline silicon 10 was not able to have the target value ranging from 0.5 mΩcm to 0.6 mΩcm. In contrast, in Examples 4 to 6, it was confirmed that the crystal pass length was obtained in a part of the ingot of the monocrystalline silicon 10 having the resistivity falling within the target resistivity range. Accordingly, when the dopant was red phosphorus and the ingot of the monocrystalline silicon 10 having the target resistivity ranging from 0.5 mΩcm to 0.6 mΩcm was produced, it was confirmed that the inner diameter of the quartz crucible 3A also preferably ranges from 2.1-fold to 2.3-fold relative to the straight-body diameter of the monocrystalline silicon 10.

Particularly, Example 7 shows that the resistivity sharply decreases as the pulling up of the monocrystalline silicon 10 progresses. The resistivity of the monocrystalline silicon 10 at the straight-body start point becomes 1.05 mΩcm and the resistivity of the monocrystalline silicon 10 at 20% of the straight-body length becomes a relatively high value to prevent dislocations. Subsequently, by sharply decreasing the resistivity, the monocrystalline silicon 10 having the target resistivity ranging from 0.5 mΩcm to 0.6 mΩcm or 0.7 mΩcm can be obtained at a high yield. When the resistivity of the monocrystalline silicon at the straight-body start point exceeds 1.05 mΩcm, a length of the straight body having the target resistivity ranging from 0.5 mΩcm to 0.6 mΩcm is very small, resulting in a low yield.

As shown in Example 8, by determining the resistivity of the monocrystalline silicon at the straight-body start point to be 0.8 mΩcm, occurrence of the dislocations in the monocrystalline silicon can be prevented, and a portion of the straight body having the target resistivity ranging from 0.5 mΩcm to 0.6 mΩcm can account for 35% of the entire straight body, and a portion of the straight body having the target resistivity ranging from 0.5 mΩcm to 0.7 mΩcm can account for 70%, which is extremely high, of the entire straight body. It should be noted that, when the resistivity of the monocrystalline silicon at the straight-body start point was determined to be 0.75 mΩcm lower than 0.8 mΩcm, dislocations in the monocrystalline silicon until reaching 20% of the straight-body length often occurred to hamper growth of the monocrystalline silicon.

[2] Ingot of Monocrystalline Silicon 10 Having Straight-Body Diameter Ranging from 301 mm to 330 mm The monocrystalline silicon 10 having a crystal diameter ranging from 301 mm to 330 mm was pulled up.

In Examples and Comparatives, a ratio of the inner diameter of the crucible 3 to the crystal diameter (=[inner diameter of crucible 3]/[crystal diameter]) was determined to fall in a range from 1.7 to 2.0 in Examples and to fall in a range from 2.5 to 2.6 in Comparatives. A charge amount was determined to fall in a range from 80 kg to 250 kg. A pull-up speed was determined to fall in a range from 0.3 mm/min to 1.0 mm/min. A crystal rotation speed was determined to fall in a range from 5 rpm to 17 rpm. The rotation speed of the crucible 3 was determined to fall in a range from 0.2 rpm to 22 rpm.

Moreover, in the first half of the straight body of the monocrystalline silicon 10, the argon gas flow rate was determined to fall in a range from 50 L/min to 150 L/min, and the furnace internal pressure was determined to fall in a range from 40 kPa to 80 kPa. In the last half of the straight body of the monocrystalline silicon 10, the argon gas flow rate was determined to fall in a range from 50 L/min to 200 L/min, and the furnace internal pressure was determined to fall in a range from 20 kPa to 80 kPa.

[2-1] with Red Phosphorus as Dopant (from 0.8 mΩcm to 1.0 mΩcm)

With red phosphorus as the dopant, when pulling up the monocrystalline silicon 10 having a crystal diameter ranging from 301 mm to 330 mm, the resistivity of the monocrystalline silicon 10 at the straight-body start point (i.e., shoulder finish point) was controlled to a range from 1.2 mΩcm to 1.7 mΩcm.

With respect to the monocrystalline silicon 10 having the straight-body diameter ranging from 301 mm to 330 mm, in the same manner as the above, the inner diameter of the quartz crucible 3A was changed relative to the straight-body diameter of the monocrystalline silicon 10, and, while the resistivity was controlled by the addition of red phosphorus as the dopant according to a plurality of standards, the monocrystalline silicon 10 doped with red phosphorus was pulled up. Results are shown in Table 3 and FIG. 4.

TABLE 3

|  |  | Comparative 3 | Comparative 4 | Example 9 | Example 10 | Example 11 | Example 12 |
|---|---|---|---|---|---|---|---|
| crucible inner diameter (inch) | | 32" | 36" | 24" | 26" | 22" | 22" |
| dopant | | red phosphorus | red phosphorus | red phosphorus | red phosphorus | red phosphorus | red phosphorus |
| crystal diameter (mm) | | 310 | 320 | 315 | 325 | 302 | 328 |
| ratio of crucible inner diameter to crystal diameter | | 2.6 | 2.8 | 1.9 | 2 | 1.9 | 1.7 |
| resistivity [mΩcm] | straight-body length 0% point (end of shoulder) | 2 | 2.4 | 1.5 | 1.7 | 1.31 | 1.24 |
|  | straight-body length 20% point | 1.73 | 2.08 | 1.32 | 1.5 | 1.19 | 1.12 |

TABLE 3-continued

|  | Comparative 3 | Comparative 4 | Example 9 | Example 10 | Example 11 | Example 12 |
|---|---|---|---|---|---|---|
| straight-body length 40% point | 1.55 | 1.82 | 1.2 | 1.35 | 1.09 | 1.04 |
| straight-body length 60% point | 1.37 | 1.6 | 1.1 | 1.2 | 1 | 0.96 |
| straight-body length 80% point | 1.2 | 1.39 | 1 | 1.09 | 0.92 | 0.89 |
| straight-body length 100% point (tail start point) | 1.05 | 1.17 | 0.9 | 0.95 | 0.83 | 0.8 |
| crystal pass length | 0% | 0% | 20% | 7% | 40% | 50% |
| number of trials with dislocations | 12 | 3 | 10 | 8 | 8 | 6 |
| number of dislocation-free trials | 0 | 0 | 4 | 2 | 5 | 5 |
| dislocation-free success rate | 0% | 0% | 29% | 20% | 38% | 45% |

Figure 4:
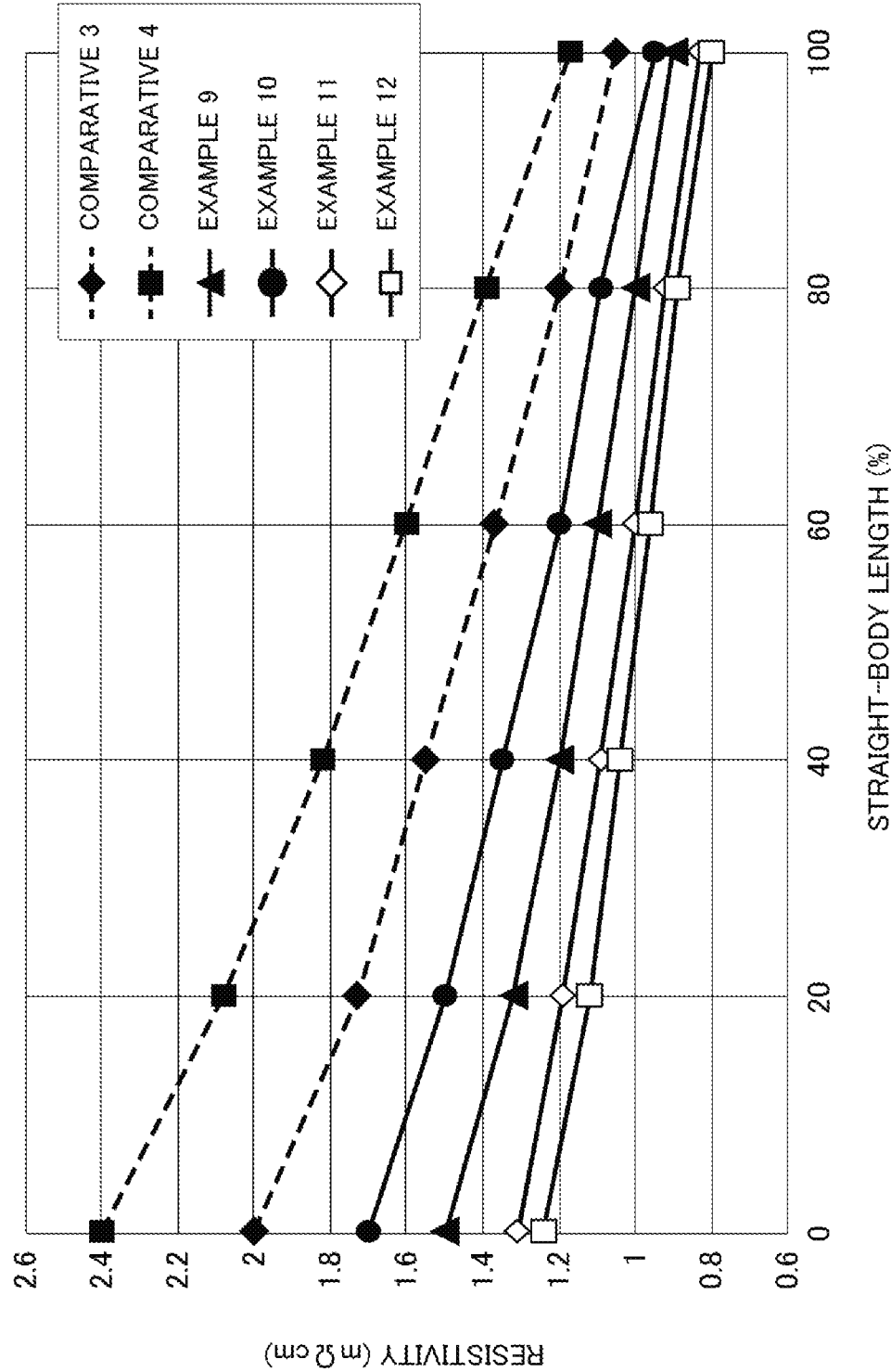
FIG. 4 is a graph showing a relationship between a straight-body length and a resistivity in monocrystalline silicon (straight-body diameter ranging from 301 mm to 330 mm) in Examples with red phosphorus as the dopant.

In Comparatives 3 and 4, the pulled-up monocrystalline silicon was not dislocation-free. FIG. 4 shows the measurement results of the resistivity of the monocrystalline silicon with dislocations by a dashed line. However, the resistivity of 1.0 mΩcm or less was not obtained.

In contrast, in Examples 9 to 12, the dislocation-free success rate of 20% or more was obtained and the crystal pass length was from 7% to 50%, showing that a part of the ingot of the monocrystalline silicon 10 was able to have the resistivity ranging from 0.8 mΩcm to 1.0 mΩcm. Accordingly, when producing the ingot of the monocrystalline silicon 10 having the target resistivity ranging from 0.8 mΩcm to 1.0 mΩcm with use of red phosphorus as the dopant, it was found sufficient that at least the inner diameter of the quartz crucible 3A was determined to fall in a range from 1.7-fold to 2.0-fold relative to the straight-body diameter of the monocrystalline silicon 10.

[2-2] with Arsenic as Dopant (from 1.7 mΩcm to 2.0 mΩcm)

With respect to the monocrystalline silicon 10 having the straight-body diameter ranging from 301 mm to 330 mm, in the same manner as the above, the inner diameter of the quartz crucible 3A was changed relative to the straight-body diameter of the monocrystalline silicon 10, and, while the resistivity was controlled by the addition of arsenic as the dopant according to a plurality of standards, the monocrystalline silicon 10 doped with arsenic was pulled up.

At this time, the resistivity of the monocrystalline silicon 10 at the straight-body start point (i.e., shoulder finish point) was controlled to a range from 2.5 mΩcm to 3.1 mΩcm. Results are shown in Table 4 and FIG. 5.

TABLE 4

|  |  | Comparative 5 | Comparative 6 | Example 13 | Example 14 | Example 15 | Example 16 |
|---|---|---|---|---|---|---|---|
| crucible inner diameter (inch) | | 32" | 36" | 24" | 26" | 22" | 22" |
| dopant | | arsenic | arsenic | arsenic | arsenic | arsenic | arsenic |
| crystal diameter (mm) | | 310 | 320 | 315 | 325 | 302 | 328 |
| ratio of crucible inner diameter to crystal diameter | | 2.6 | 2.8 | 1.9 | 2 | 1.9 | 1.7 |
| resistivity [mΩcm] | straight-body length 0% point (end of shoulder) | 3.38 | 3.66 | 2.87 | 3.1 | 2.67 | 2.5 |
|  | straight-body length 20% point | 2.91 | 3.16 | 2.53 | 2.66 | 2.36 | 2.2 |
|  | straight-body length 40% point | 2.53 | 2.77 | 2.24 | 2.37 | 2.11 | 1.99 |
|  | straight-body length 60% point | 2.27 | 2.45 | 2.03 | 2.16 | 1.9 | 1.81 |
|  | straight-body length 80% point | 2.13 | 2.25 | 1.93 | 2.03 | 1.83 | 1.75 |
|  | straight-body length 100% point (tail start point) | 2.1 | 2.2 | 1.86 | 1.95 | 1.76 | 1.7 |
| crystal pass length | | 0% | 0% | 34% | 13% | 50% | 61% |
| number of trials with dislocations | | 20 | 3 | 15 | 19 | 14 | 33 |
| number of dislocation-free trials | | 0 | 0 | 3 | 2 | 4 | 17 |
| dislocation-free success rate | | 0% | 0% | 17% | 10% | 22% | 34% |

Figure 5:
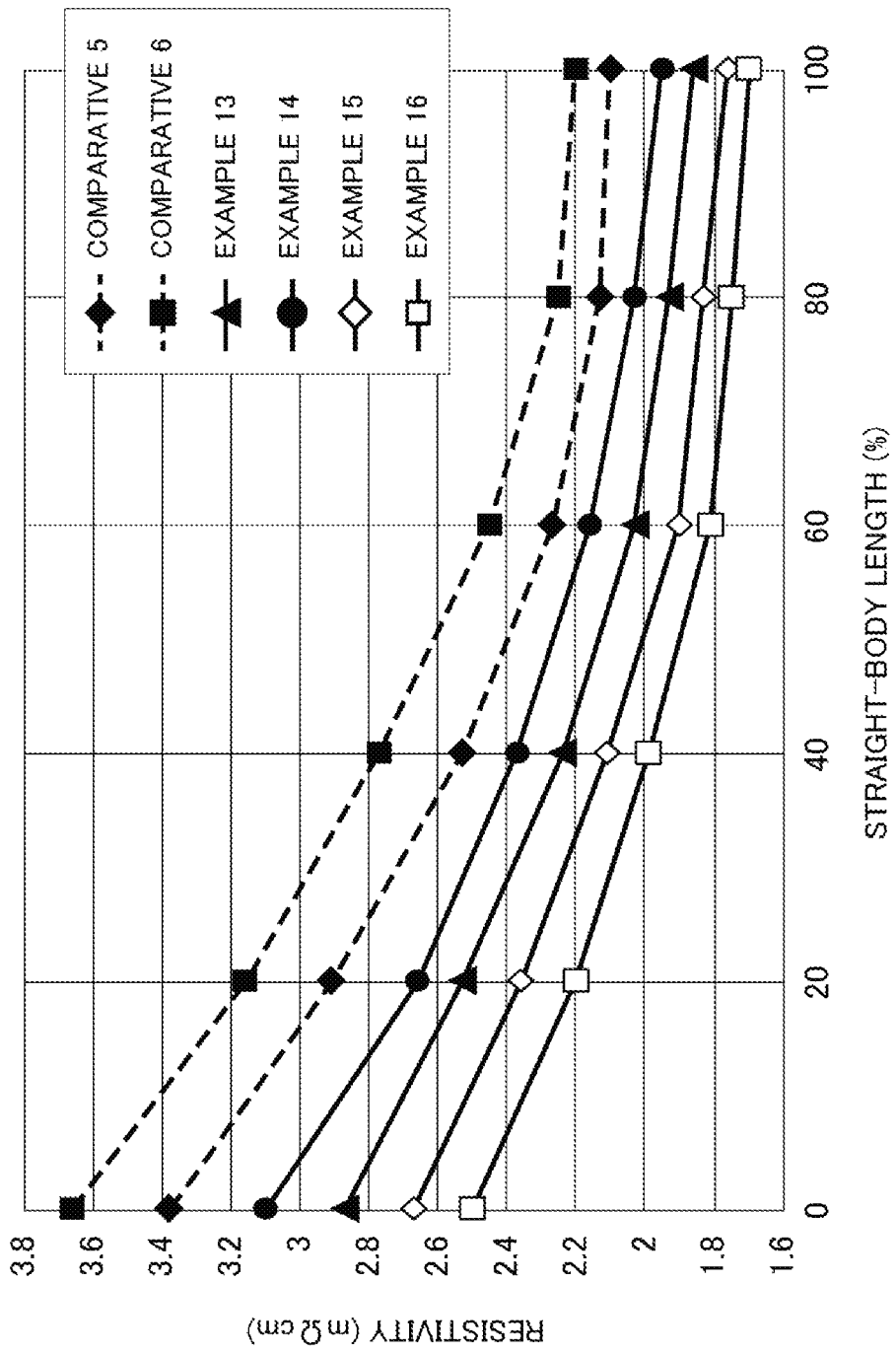
FIG. 5 is a graph showing a relationship between a straight-body length and a resistivity in monocrystalline silicon (straight-body diameter ranging from 301 mm to 330 mm) in Examples with arsenic as the dopant.

In Comparatives 5 and 6, the pulled-up monocrystalline silicon was not dislocation-free. FIG. 5 shows the measurement results of the resistivity of the monocrystalline silicon with dislocations by a dashed line. However, the resistivity of 2.0 mΩcm or less was not obtained.

In Examples 13 to 16, the dislocation-free success rate of 10% or more was obtained and the crystal pass length was from 13% to 61%, showing that a part of the ingot of the monocrystalline silicon 10 was able to have the resistivity ranging from 1.7 mΩcm to 2.0 mΩcm. Accordingly, when producing the ingot of the monocrystalline silicon 10 having the target resistivity ranging from 1.7 mΩcm to 2.0 mΩcm with use of arsenic as the dopant, it was found sufficient that at least the inner diameter of the quartz crucible 3A was determined to fall in a range from 1.7-fold to 2.0-fold relative to the straight-body diameter of the monocrystalline silicon 10.

The invention claimed is:

1. A producing method of an n-type monocrystalline silicon by pulling up the n-type monocrystalline silicon from a silicon melt comprising a main dopant in a form of arsenic and growing the n-type monocrystalline silicon according to a Czochralski process, wherein:

the n-type monocrystalline silicon is pulled up using a quartz crucible whose inner diameter ranges from 1.7-fold to 2.0-fold relative to a straight-body diameter of the n-type monocrystalline silicon, in which a part of the n-type monocrystalline silicon exhibits an electrical resistivity ranging from 1.7 mΩcm to 2.0 mΩcm and the straight-body diameter of the n-type monocrystalline silicon ranges from 301 mm to 330 mm.

2. The producing method of the n-type monocrystalline silicon according to claim 1, wherein the n-type monocrystalline silicon is pulled up using a pull-up apparatus whose furnace internal pressure is set in a range from 40 kPa to 80 kPa.

3. The producing method of the n-type monocrystalline silicon according to claim 1, wherein the silicon melt in the quartz crucible is applied with a magnetic field having a magnetic field intensity ranging from 0.2 T to 0.4 T in pulling up the n-type monocrystalline silicon.

* * * * *